(12) United States Patent
Sakai

(10) Patent No.: US 11,387,352 B2
(45) Date of Patent: Jul. 12, 2022

(54) POWER SEMICONDUCTOR DEVICE AND MANUFACTURING METHOD THEREOF

(71) Applicant: Mitsubishi Electric Corporation, Tokyo (JP)

(72) Inventor: Norikazu Sakai, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/077,854

(22) Filed: Oct. 22, 2020

(65) Prior Publication Data

US 2021/0249526 A1     Aug. 12, 2021

(30) Foreign Application Priority Data

Feb. 12, 2020   (JP) .............................. JP2020-021758

(51) Int. Cl.
| | | |
|---|---|---|
| H01L 23/00 | (2006.01) | |
| H01L 23/49 | (2006.01) | |
| H01L 29/66 | (2006.01) | |
| H01L 29/51 | (2006.01) | |
| H01L 29/739 | (2006.01) | |
| H01L 29/20 | (2006.01) | |

(52) U.S. Cl.
CPC ........ H01L 29/66992 (2013.01); H01L 29/51 (2013.01); H01L 29/7393 (2013.01); H01L 29/2003 (2013.01)

(58) Field of Classification Search
CPC . H01L 2224/48139; H01L 2224/26145; H01L 2224/26175; H01L 2224/32225
See application file for complete search history.

(56) References Cited

U.S. PATENT DOCUMENTS

| | | | | |
|---|---|---|---|---|
| 6,762,491 | B1* | 7/2004 | Hatae ................. | H01L 23/3735 257/687 |
| 2007/0241440 | A1* | 10/2007 | Hoang ................... | H01L 21/52 257/685 |
| 2011/0037153 | A1* | 2/2011 | Zhu ......................... | H01L 24/97 257/676 |
| 2012/0061816 | A1* | 3/2012 | Song .................... | H01L 23/552 257/696 |
| 2017/0251576 | A1* | 8/2017 | Jeong ....................... | H05K 1/09 |
| 2018/0130755 | A1* | 5/2018 | Lee ....................... | H01L 23/552 |
| 2018/0240775 | A1* | 8/2018 | Tsudome ............... | H01L 33/62 |
| 2020/0219822 | A1* | 7/2020 | Kim ...................... | H01L 23/538 |
| 2020/0365476 | A1* | 11/2020 | Otsubo ............... | H01L 23/5386 |

FOREIGN PATENT DOCUMENTS

JP         5665786 B2    2/2015

* cited by examiner

*Primary Examiner* — Eric A. Ward

(74) *Attorney, Agent, or Firm* — Studebaker & Brackett PC

(57) ABSTRACT

An object of the present disclosure is to suppress a shrinkage cavity without affecting the layout or the insulation performance of the semiconductor element in a power semiconductor device. A power semiconductor device includes a heat radiation plate; an insulating substrate bonded in a bonding region on an upper surface of the heat radiation plate with a bonding material containing a plurality of elements having different solidification points; a semiconductor element mounted on an upper surface of the insulating substrate; and a bonding wire bonded in the bonding region on the upper surface of the heat radiation plate such that the bonding wire surrounds the semiconductor element in plan view.

7 Claims, 11 Drawing Sheets

POWER SEMICONDUCTOR DEVICE AND MANUFACTURING METHOD THEREOF

BACKGROUND OF THE INVENTION

Field of the Invention

The present disclosure relates to suppression of a shrinkage cavity in a power semiconductor device.

Description of the Background Art

A shrinkage cavity of a bonding material in a power semiconductor device has been a problem. When the solidification points of the plurality of elements contained in a bonding material are different, and an element solidified earlier is pulled by metal solidified later to generate a crack. This phenomenon is called a shrinkage cavity. For example, in a lead-free solder containing Sn as a main component, the pure Sn portion solidifies earlier at 232° C., and then the eutectic portion of the additive element solidifies later. For example, Sn—Ag—Cu solidifies at 217° C. Metal shrinks as it solidifies, Sn solidifies earlier is pulled and cracks occur. Not only shrinkage cavity generation affects heat radiation a wire bonding failure such as a chip crack is caused by shrinkage cavity generation during wire bonding. For this reason, suppression of a shrinkage cavity is necessary.

Japanese Patent No. 5665786 discloses a method of suppressing a shrinkage cavity by subjecting a back surface Cu pattern of an insulating substrate to dimple processing. However, vacancies are formed with the dimples with the method of Japanese Patent No. 5665786, and insulation is not secured. Further, in a case where the semiconductor element is placed on dimples, due to the design constraints of the layout of the semiconductor element (chip), the heat radiation effect of the semiconductor element is lowered by the vacancies. Therefore, the problem is that dimples for suppressing a shrinkage cavity cannot be provided on the outer periphery of the semiconductor element. In addition, the semiconductor element needs to be placed away from the outer periphery of the insulating substrate, which impairs the degree of freedom in design.

SUMMARY

The technique of the present disclosure is to suppress a shrinkage cavity without affecting the layout or the insulation performance of the semiconductor element in a power semiconductor device.

The power semiconductor device according to the present disclosure includes a heat radiation plate, an insulating substrate, and a semiconductor element. The insulating substrate is bonded in a bonding region on an upper surface of the heat radiation plate with a bonding material containing a plurality of elements having different solidification points. The semiconductor element is mounted on the upper surface of the insulating substrate. A metal wire is bonded in the bonding region on the upper surface of the heat radiation plate such that the metal wire surrounds the semiconductor element in plan view.

According to the power semiconductor device of the present disclosure, the shrinkage cavity is suppressed from stretching because the interfacial tension occurs in the bonding material in contact with the heat radiation plate and the metal wire is a force toward the opposite direction to the shrinkage force of the bonding material that stretches the shrinkage cavity. As a result, the shrinkage cavity is suppressed from stretching immediately below the semiconductor element; therefore, the wire bonding is appropriately formed on the upper surface of the semiconductor element. Further, no dimples are formed on the insulating substrate; therefore, the degree of freedom in layout or the insulating performance of the semiconductor element is not impaired.

The manufacturing method of the power semiconductor device of the present disclosure includes bonding a metal wire on an upper surface of a heat radiation plate, bonding an insulating substrate, in an upper surface of the heat radiation plate, with solder containing a plurality of elements having different solidification points, and mounting a semiconductor element on an upper surface of the insulating substrate, in which the metal wire is bonded in a bonding region to which the insulating substrate on the upper surface of the heat radiation plate is bonded such that the metal wire surrounds the semiconductor element in plan view.

According to the manufacturing method of the power semiconductor device of the present disclosure, the shrinkage cavity is suppressed from stretching immediately below the semiconductor element; therefore, the wire bonding is appropriately formed on the upper surface of the semiconductor element. Further, no dimples are formed on the insulating substrate; therefore, the degree of freedom in layout or the insulating performance of the semiconductor element is not impaired.

These and other objects, features, aspects and advantages of the present invention will become more apparent from the following detailed description of the present invention when taken in conjunction with the accompanying drawings.

DESCRIPTION OF THE PREFERRED EMBODIMENTS

A. Underlying Technique

Figures 1A, 1B:
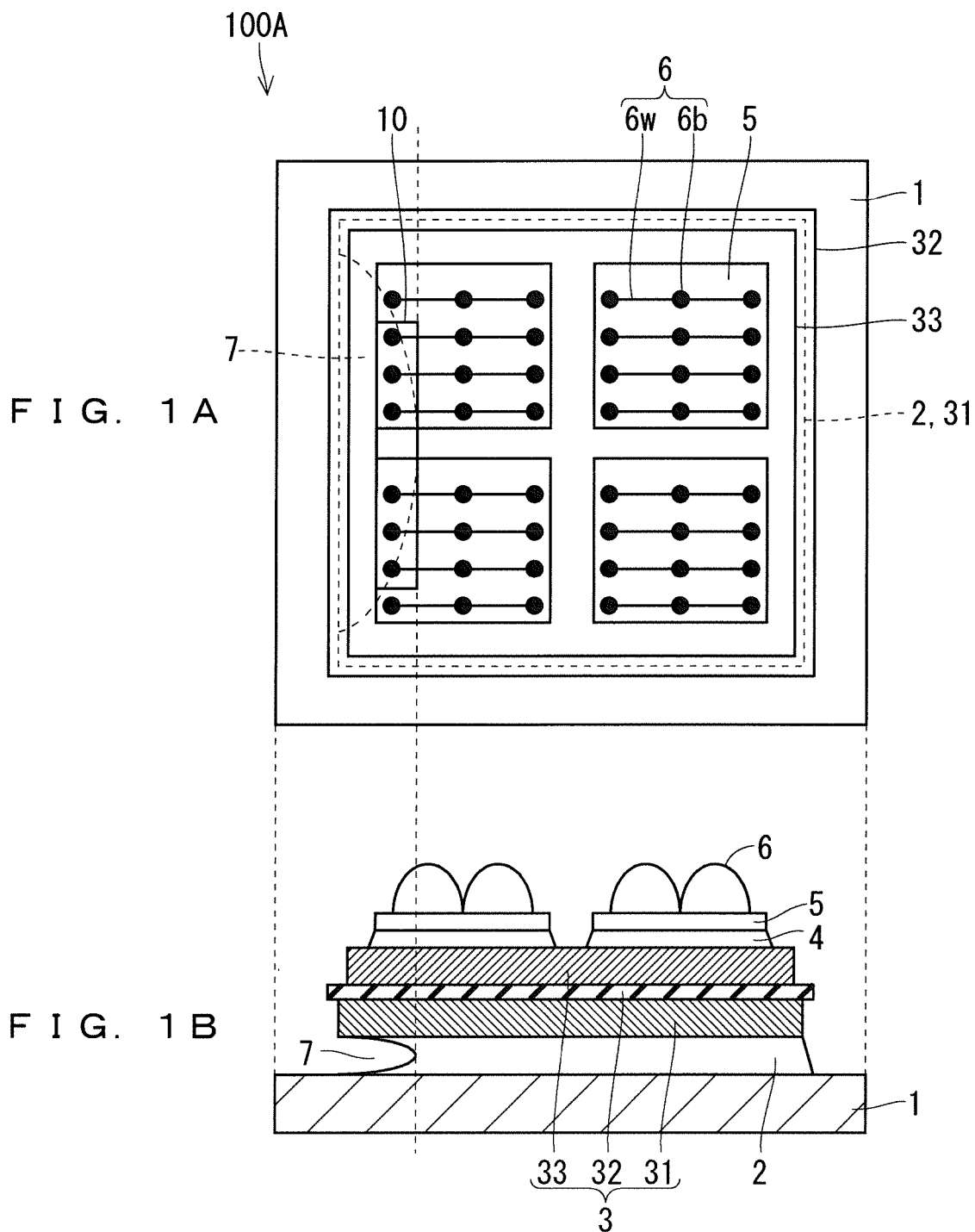
FIGS. 1A and 1B are configuration diagrams of a power semiconductor device of an underlying technique.

FIGS. 1A and 1B illustrate a configuration of the power semiconductor device 100A of a first underlying technique. FIG. 1A is a top view of the power semiconductor device 100A, and FIG. 1B is a cross-sectional view of the power semiconductor device 100A.

The power semiconductor device 100A includes a heat radiation plate 1, an insulating substrate 3, and a semiconductor element 5. The insulating substrate 3 has a configuration in which an insulating base material 32 is interposed between a lower surface metal pattern 31 and an upper surface metal pattern 33. For example, the lower surface metal pattern 31 and the upper surface metal pattern 33 are composed of Cu, and the insulating base material 32 is composed of silicon nitride. The lower surface metal pattern 31 of the insulating substrate 3 is bonded to the upper surface of the heat radiation plate 1 with solder 2. A plurality of semiconductor elements 5 are bonded to the upper surface of the upper surface metal pattern 33 with solder 4. The solder 2 and the solder 4 are an example of bonding materials.

Wire bonding 6 is formed on the upper surface of the semiconductor element 5. The wire bonding 6 has a configuration in which bonding portions 6b and a bonding wire 6w between the bonding portions 6b. The semiconductor element 5 is a switching element that controls electric power and requires heat radiation. As semiconductor materials of the semiconductor element 5, wide band gap semiconductors such as SiC or GaN is used in addition to Si.

The solder 2 contains Sn as a main component. FIG. 1 illustrates a state in which a shrinkage cavity 7 is generated in the solder 2 below the end portion of the insulating substrate 3. There is a problem in that, in a region 10 of the semiconductor element 5, the wire bonding 6 is not formed properly because the ultrasonic vibration at the time of wire bonding is not transmitted due to the shrinkage cavity 7 immediately below the region 10.

Figure 2:
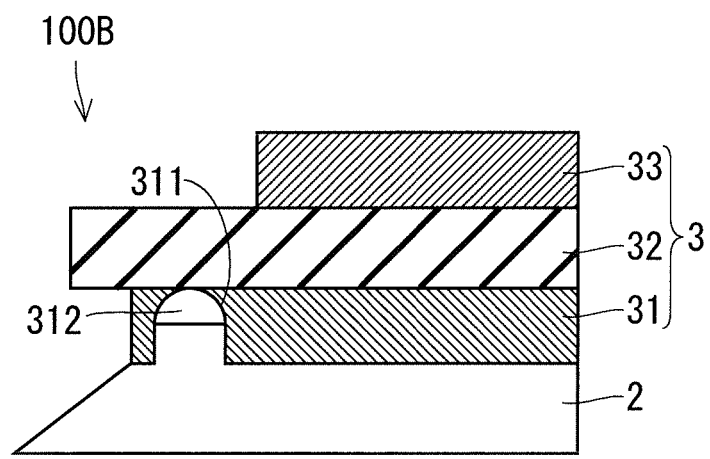
FIG. 2 is a cross-sectional view illustrating the power semiconductor device of the underlying technique in which dimples are formed on a lower surface metal pattern of an insulating substrate.

FIG. 2 is a cross-sectional view of a power semiconductor device 100B of a second underlying technique. The solder 4, the semiconductor element 5, and the wire bonding 6 are not illustrated in FIG. 2. The power semiconductor device 100B is different from the power semiconductor device 100A of the first underlying technique in that a dimple 311 is formed on the lower surface metal pattern 31 of the insulating substrate 3.

The dimple 311 suppress the generation of the shrinkage cavity 7 in the solder 2. However, the dimple 311 has an unfilled portion 312 in which the solder 2 is not filled and a bubble is trapped. Therefore, in a case where the semiconductor element 5 is disposed on the end portion of the upper surface metal pattern 33, the dimple 311 cannot be formed for avoiding lowering of heat radiation. Further, even if the condition of heat radiation is satisfied and the dimple 311 is formed, the insulating performance at a high altitude is lowered due to the lowering of the insulating performance by the unfilled portion 312.

Therefore, in Embodiment 1 described below, a shrinkage cavity in the solder 2 containing Sn as a main component is suppressed without affecting the layout or the insulation performance of the semiconductor element 5.

B. Embodiment 1

B-1. Outline

Figure 3:
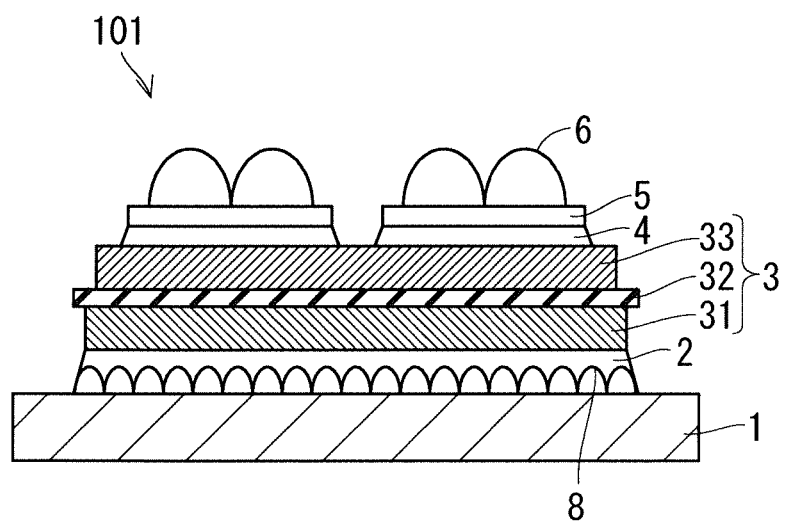
FIG. 3 is a cross-sectional view illustrating a power semiconductor device according to Embodiment 1.

FIG. 3 is a cross-sectional view illustrating a power semiconductor device 101 according to Embodiment 1. The power semiconductor device 101 is different from the power semiconductor device 100A of the first underlying technique in that wire bonding 8 is formed on the upper surface of the heat radiation plate 1.

B-2. Manufacturing Process

The manufacturing processes of the power semiconductor device 101 will be described below with reference to FIGS. 4A to 10B. FIGS. 4A, 5A, 6A, 7A, 8A, 9A, and 10A are top views and FIGS. 4B, 5B, 6B, 7B, 8B, 9B, and 10B are cross-sectional views.

Figure 4A:
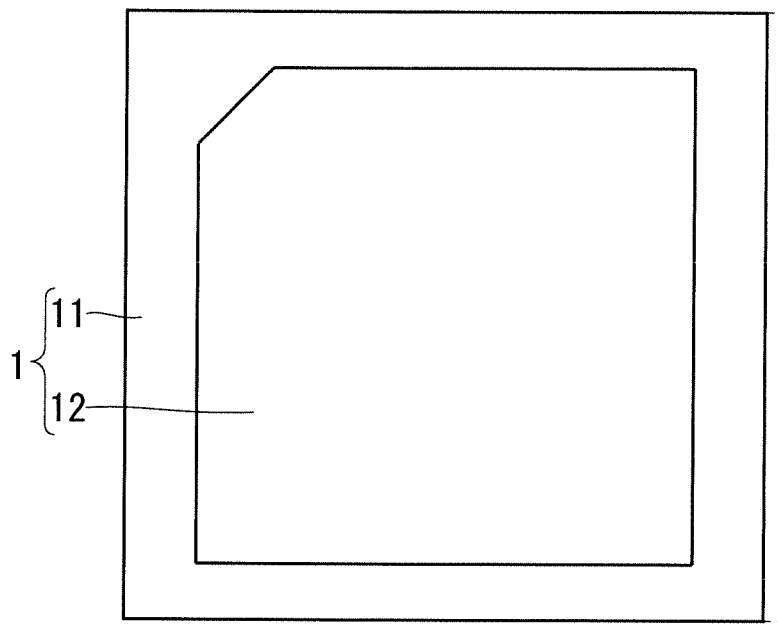
FIGS. 4A and 4B are diagrams illustrating a manufacturing process of the power semiconductor device according to Embodiment 1.
Figure 4B:
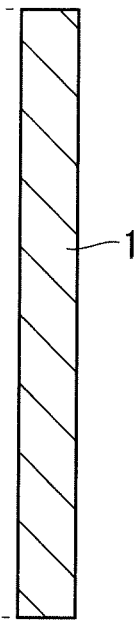

First, as illustrated in FIGS. 4A and 4B, a heat radiation plate 1 is prepared. A region of the upper surface of the heat radiation plate 1, on which the solder 2 is mounted in later Step is referred to as a bonding region 12. The heat radiation plate 1 is formed of a Cu base plate, and a resist is applied to a region 11 other than the bonding region 12 of the heat radiation plate 1. On the other hand, a resist is not applied to the bonding region 12 and the bonding region 12 is a pure Cu material. However, the bonding region 12 may be plated with Ni.

Figure 5A:
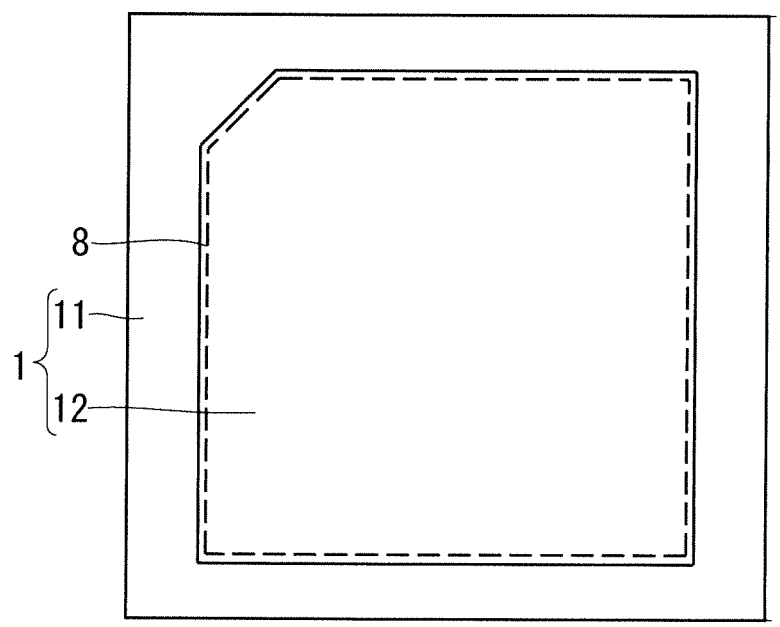
FIGS. 5A and 5B are diagrams illustrating a manufacturing process of the power semiconductor device according to Embodiment 1.
Figure 5B:
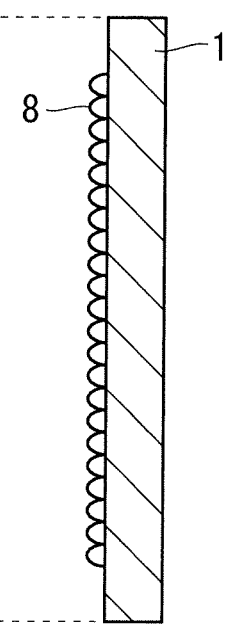

Next, as illustrated in FIGS. 5A and 5B, wire bonding 8 is formed in the bonding region 12 on the upper surface of the heat radiation plate 1 along each side of the outer periphery of the bonding region 12.

Figure 6A:
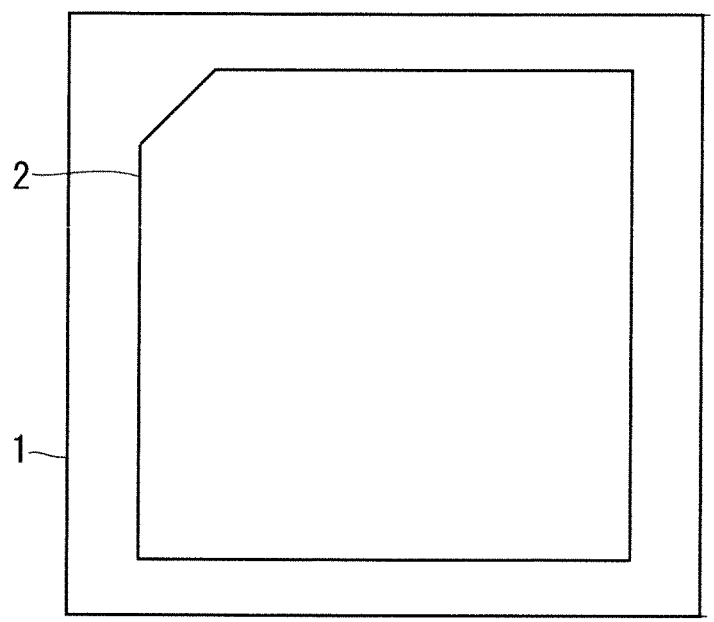
FIGS. 6A and 6B are diagrams illustrating a manufacturing process of the power semiconductor device according to Embodiment 1.
Figure 6B:
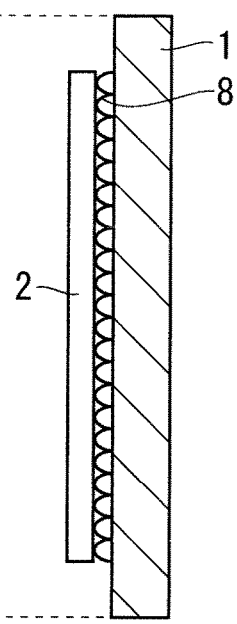

Then, as illustrated in FIGS. 6A and 6B, the solder 2 is mounted on the bonding region 12 on the upper surface of the heat radiation plate 1.

Figure 7A:
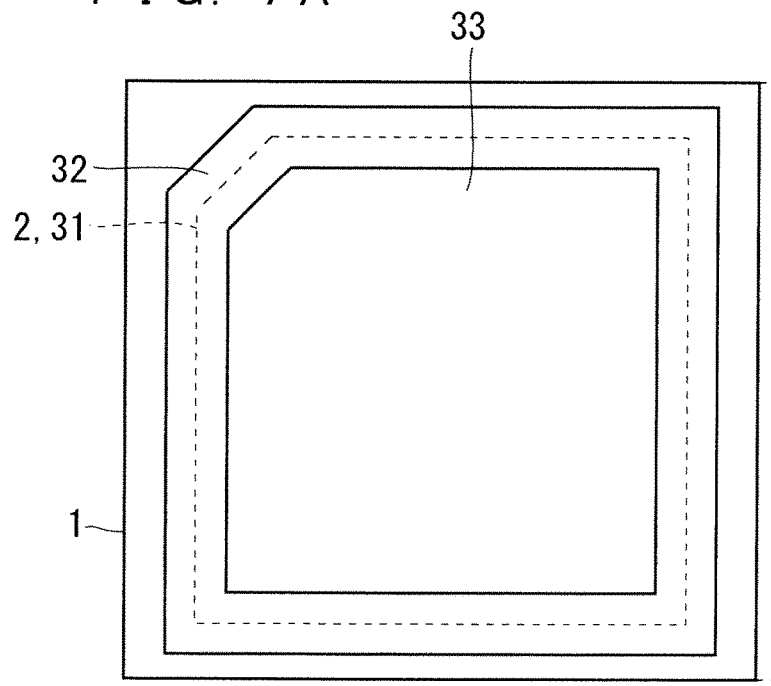
FIGS. 7A and 7B are diagrams illustrating a manufacturing process of the power semiconductor device according to Embodiment 1.
Figure 7B:
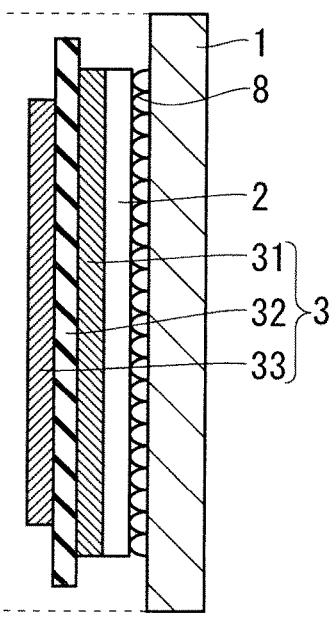

Next, as illustrated in FIGS. 7A and 7B, the insulating substrate 3 is bonded to the heat radiation plate 1 with the solder 2.

Figure 8A:
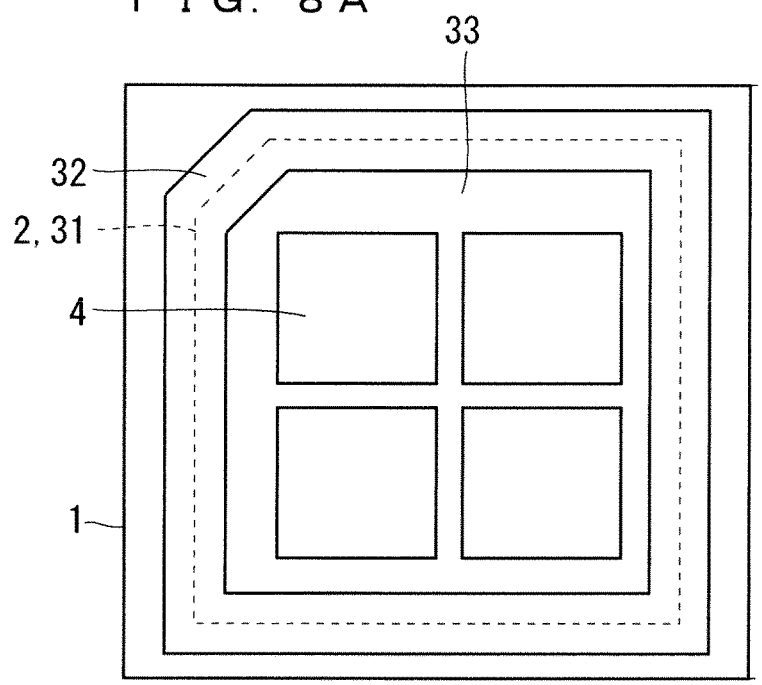
FIGS. 8A and 8B are diagrams illustrating a manufacturing process of the power semiconductor device according to Embodiment 1.
Figure 8B:
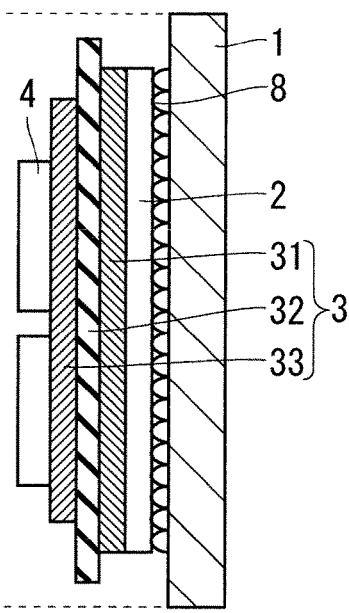

Thereafter, as illustrated in FIGS. 8A and 8B, the solder 4 is mounted on the upper surface of the upper surface metal pattern 33 of the insulating substrate 3.

Figure 9A:
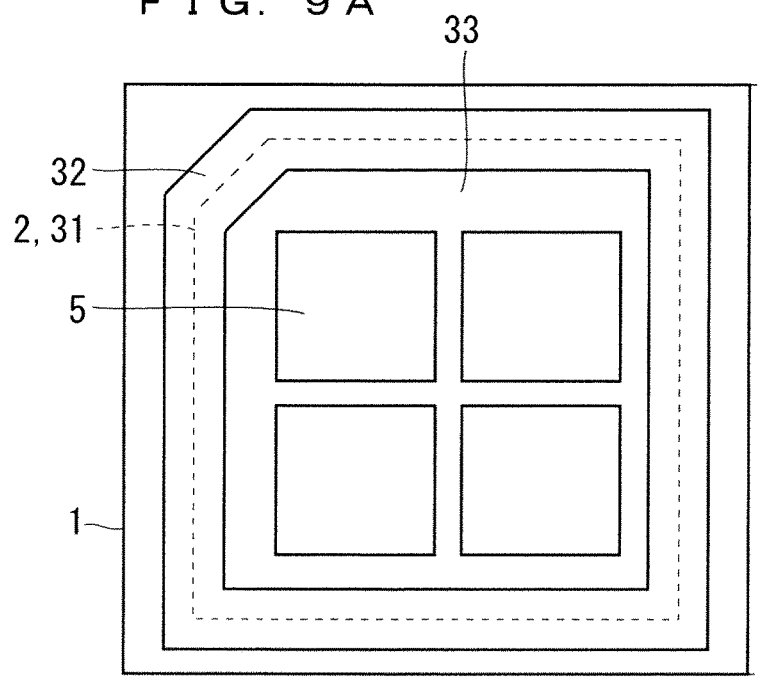
FIGS. 9A and 9B are diagrams illustrating a manufacturing process of the power semiconductor device according to Embodiment 1.
Figure 9B:
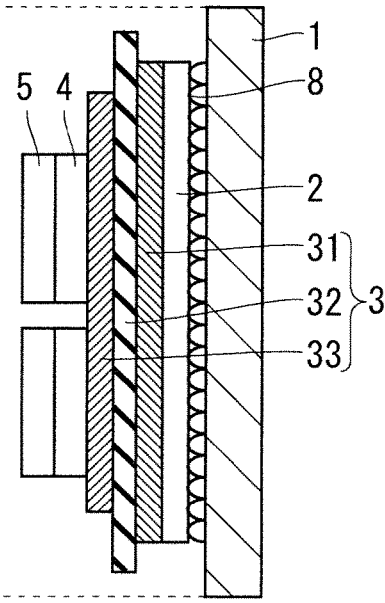

Next, as illustrated in FIGS. 9A and 9B, a plurality of semiconductor elements 5 are bonded to the upper surface metal pattern 33 of the insulating substrate 3 with the solder 4. FIGS. 6A to 9B illustrate a state where the solder 2 does not yet wet the bonding wire of the wire bonding 8.

Figures 10A, 10B:
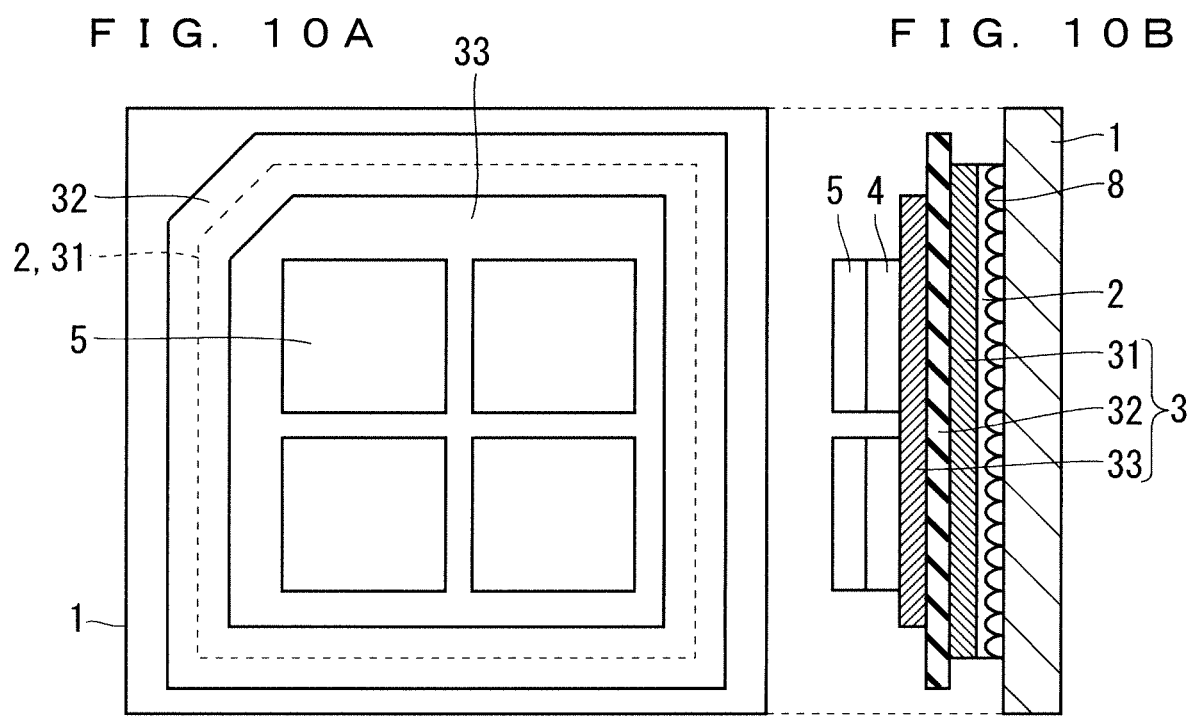
FIGS. 10A and 10B are diagrams illustrating a manufacturing process of the power semiconductor device according to Embodiment 1.

Then, as illustrated in FIGS. 10A and 10B, the solder 2 wets the bonding wire of the wire bonding 8 and enters under the loops of the bonding wire.

B-3. Bonding Wire

Figure 11:
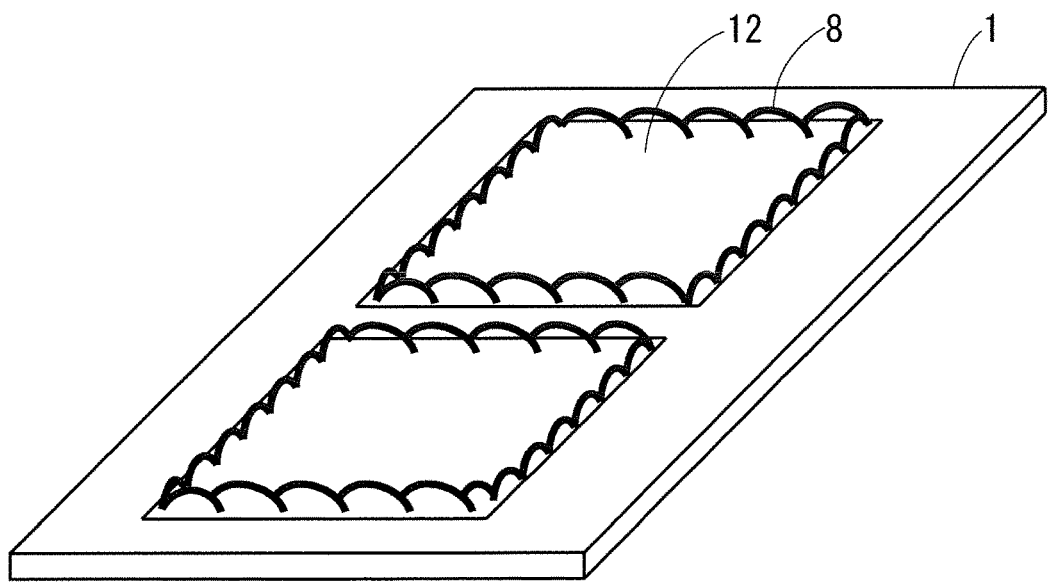
FIG. 11 is a perspective view illustrating a state in which wire bonding is formed on the upper surface of the heat radiation plate.

FIG. 11 is a perspective view illustrating a state in which the wire bonding 8 is formed on the upper surface of the heat radiation plate 1. The wire bonding 8 is formed in the bonding region 12 on the upper surface of the heat radiation plate 1 along each side of the outer periphery of the bonding region 12.

Figure 12A:
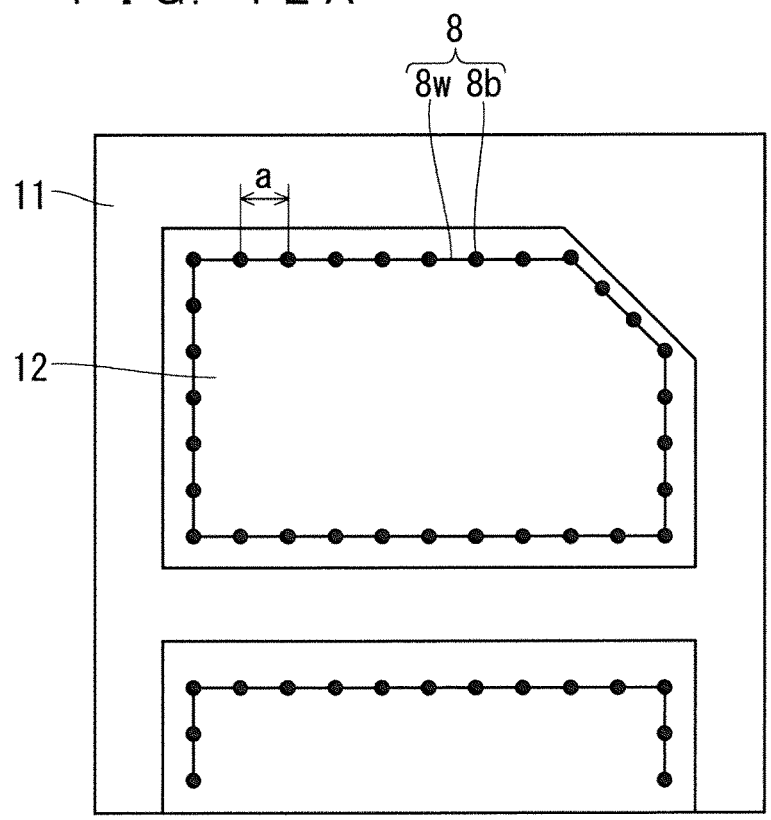
FIGS. 12A and 12B are diagrams illustrating a bonding interval and a loop height in wire bonding.
Figure 12B:
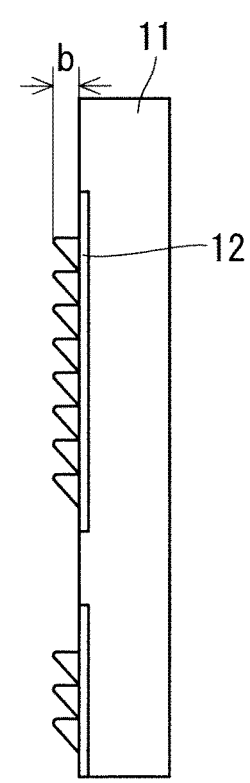

As illustrated in FIGS. 12A and 12B, the wire bonding 8 includes bonding portions 8b and a bonding wire 8w between the bonding portions 8b. The bonding wire 8w contains Cu or Ag as a main component. The bonding wire 8w reacts with the solder 2 containing Sn as a main component to form an intermetallic compound.

The diameter of the bonding wire 8w is 200 µm or more and 500 µm or less. An interval a between the bonding portions 8b illustrated in FIG. 12A is 1.0 mm or more. The height b of the loops formed by the bonding wire 8w illustrated in FIG. 12B is 0.1 mm or more. By satisfying these conditions, the solder 2 is allowed to enter under the loops of the bonding wire 8w.

Figure 13:
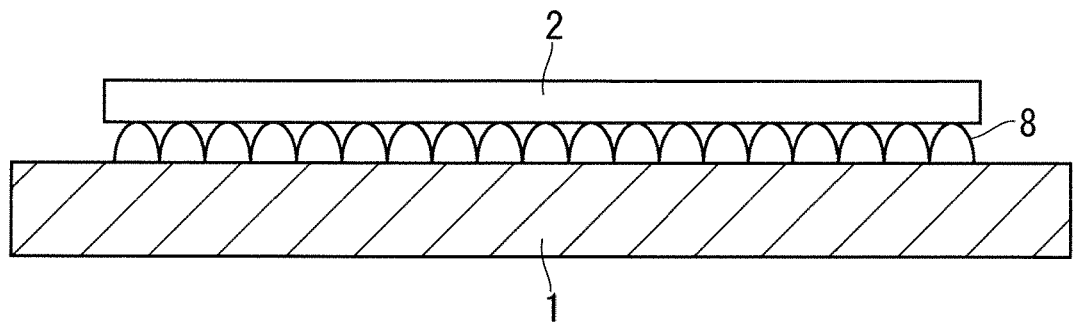
FIG. 13 is a cross-sectional view illustrating a state in which solder is formed on the upper surface of the heat radiation plate.
Figure 14:
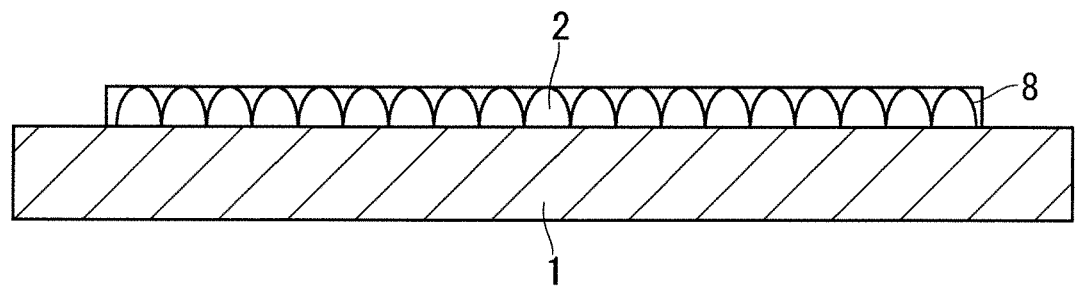
FIG. 14 is a cross-sectional view illustrating a state in which the solder flows into under the loops.
Figure 15:
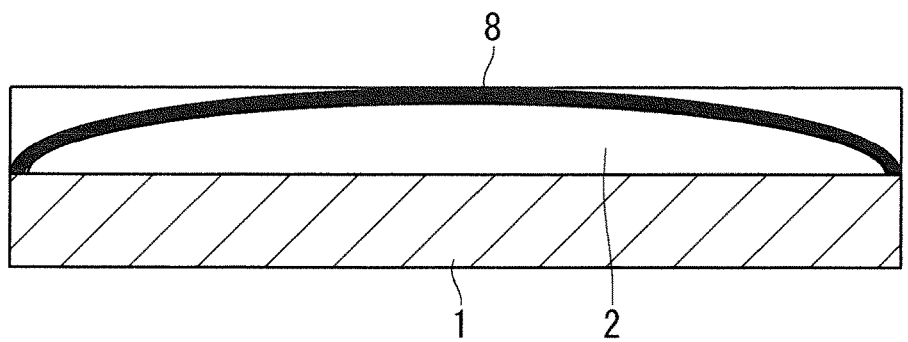
FIG. 15 is an enlarged view of an essential part of FIG. 14.

FIG. 13 is a cross-sectional view illustrating a state immediately after the solder 2 is mounted on the upper surface of the heat radiation plate 1. The molten solder 2 wets the bonding wire 8w composed of Ag or Cu, and flows under the loops formed by the bonding wire 8w as illustrated in FIG. 14. FIG. 15 is an enlarged view of FIG. 14 for one loop of the bonding wire 8w.

Figure 16:
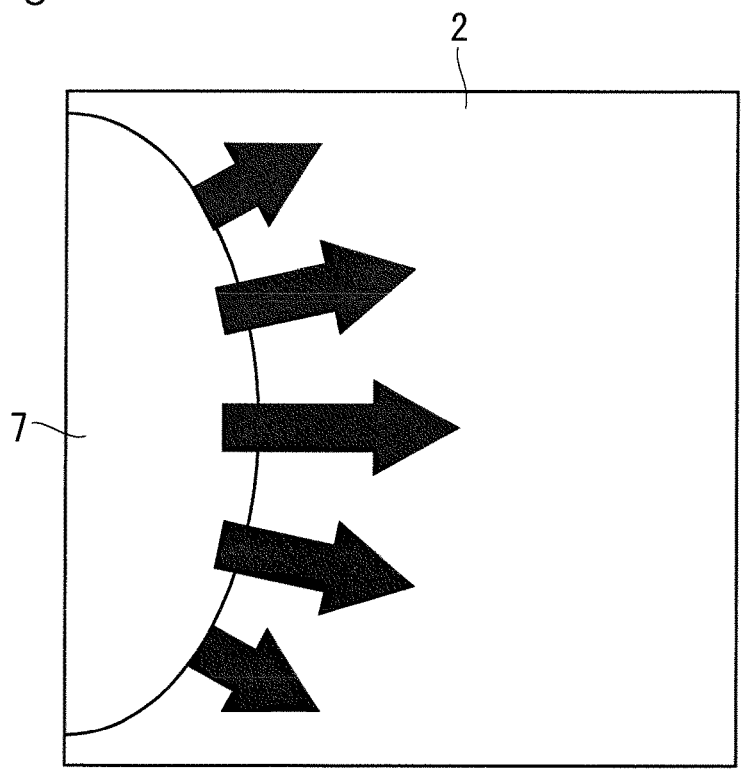
FIG. 16 is a diagram illustrating shrinkage force generated in the solder in the power semiconductor device of the underlying technique.
Figure 17:
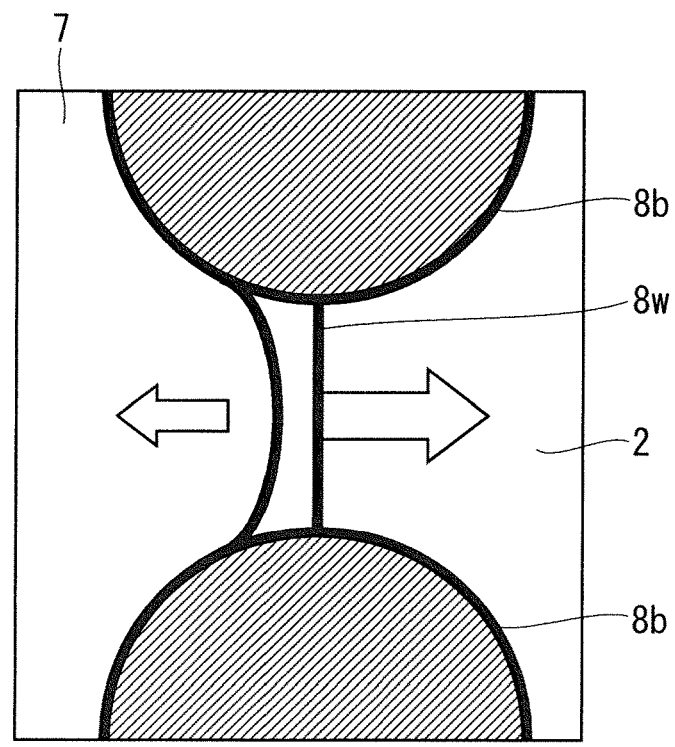
FIG. 17 is a diagram illustrating the relationship between the shrinkage force and the tension of the solder under a loop.
Figure 18:
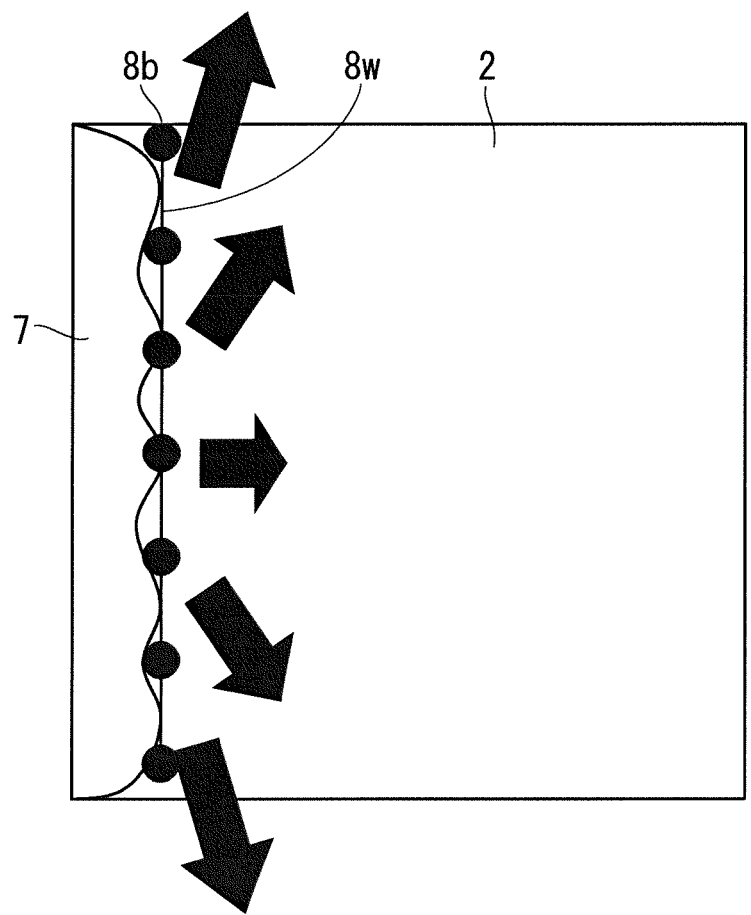
FIG. 18 is a diagram illustrating shrinkage force generated in the solder in the power semiconductor device of Embodiment 1.

Then, the solder 2 is cooled and is to solidify and shrink. Without the wire bonding 8 being formed on the upper surface of the heat radiation plate 1, the shrinkage cavity 7 stretches due to the shrinkage force of the solder 2 indicated by the arrows in FIG. 16. However, in the power semiconductor device 101, the interfacial tension of the solder 2 indicated by the arrow pointing left in FIG. 17 is a reaction force to the shrinkage force of the solder 2 indicated by the arrow pointing right. Consequently, as illustrated in FIG. 18, the shrinkage cavity 7 is suppressed from stretching inward of the wire bonding 8.

As illustrated in FIGS. 5A, 5B, or 11, the wire bonding 8 is formed in the bonding region 12 on the upper surface of the heat radiation plate 1 along the outer periphery of the bonding region 12. Therefore, the wire bonding 8 is formed such that the wire bonding 8 surrounds the semiconductor element 5 in plan view. As described above, the shrinkage cavity 7 does not stretch inward of the wire bonding 8; therefore, the wire bonding 6 on the upper surface of the semiconductor element 5 is appropriately performed in consequence, without the shrinkage cavity 7 stretching immediately below the semiconductor element 5.

Further, as illustrated in FIG. 14, by allowing the solder 2 to enter under the loops of the bonding wire 8w, the solder 2 is to have the thickness equal to the height b of the loops. Therefore, by controlling the height b of the loops, the thickness of the solder 2 can be controlled to a desired thickness.

Figure 19A:
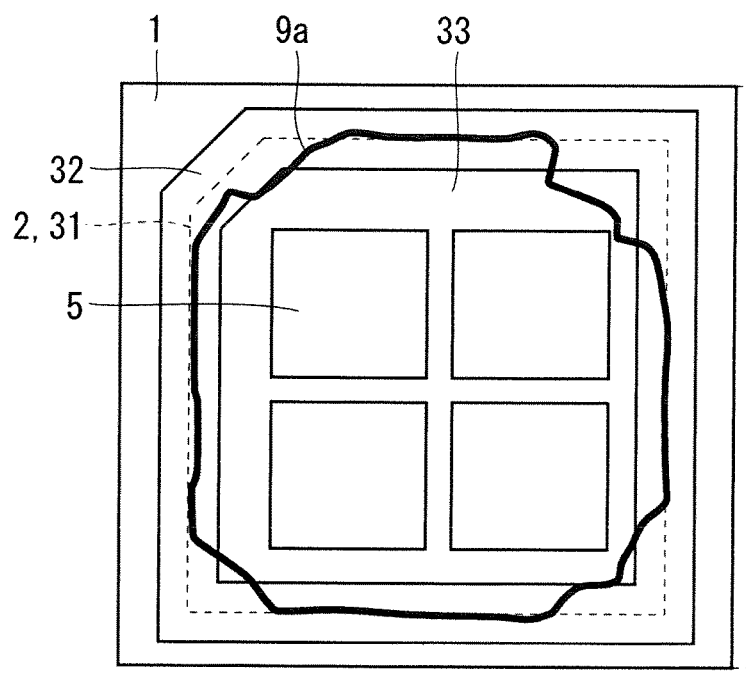
FIGS. 19A and 19B are diagrams illustrating a state in which a crack is generated in the solder in the power semiconductor device of the underlying technique.
Figure 19B:
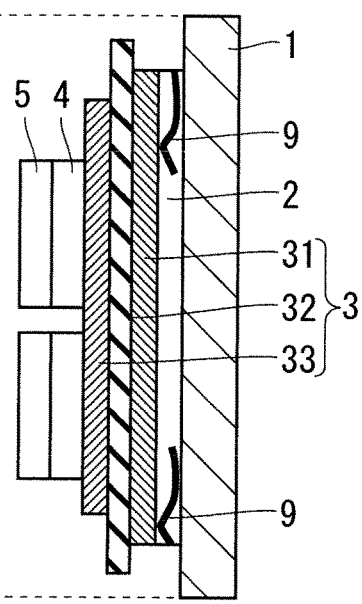

The linear thermal expansion coefficients are different between the insulating substrate 3 and the heat radiation plate 1 due to the difference in materials. For example, when the material of the heat radiation plate 1 is Cu, the linear thermal expansion coefficient of the heat radiation plate 1 is 16.2. When the material of the insulating base material 32 is silicon nitride and the material of the lower surface metal pattern 31 and the upper surface metal pattern 33 is Cu, the linear thermal expansion coefficient of the entire insulating substrate 3 is 6.2. Therefore, stress occurs in the solder 2 during the temperature cycle test due to the difference in thermal expansion coefficient between the insulating substrate 3 and the heat radiation plate 1, and a crack 9 is generated in the horizontal direction as illustrated in FIGS. 19A and 19B. The crack 9 extends from the end portion toward the inside of the solder 2. In FIG. 19A, the position where the crack 9 has extended the most is indicated by reference numeral 9a.

On the other hand, in the power semiconductor device 101 of Embodiment 1, the wire bonding 8 is formed along the all sides of the bonding region 12 of the heat radiation plate 1 with respect to the insulating substrate 3, and the intermetallic compound is generated between the bonding wire 8w and the solder 2. The intermetallic compound is, for example, $Cu_6Sn_5$, $Cu_3Sn$, or $Ag_3Sn$. Consequently, the crack 9 is suppressed during the temperature cycle test because the solder 2 withstands the stress generated due to the difference in thermal expansion coefficient between the insulating substrate 3 and the heat radiation plate 1 described above. That is, the power semiconductor device 101 has crack resistance in the temperature cycle test.

B-4. Effect

The power semiconductor device 101 according to Embodiment 1 includes the heat radiation plate 1, the insulating substrate 3 bonded in the bonding region 12 on the upper surface of the heat radiation plate 1 with the solder 2 which is a bonding material containing a plurality of elements having different solidification points, the semiconductor element 5 mounted on the upper surface of the insulating substrate 3, and the bonding wire 8w which is a metal wire bonded in the bonding region 12 on the upper surface of the heat radiation plate 1 such that the bonding wire 8w surrounds the semiconductor element 5 in plan view. Therefore, the shrinkage cavity 7 is suppressed from stretching because the interfacial tension occurs in the solder 2 in contact with the heat radiation plate 1 and the bonding wire 8w is a force toward the opposite direction to the shrinkage force of the solder 2 that stretches the shrinkage cavity 7. As a result, the shrinkage cavity 7 is suppressed from stretching immediately below the semiconductor element 5; therefore, the wire bonding 6 is appropriately formed on the upper surface of the semiconductor element 5. Further, no dimples are formed on the insulating substrate 3; therefore, the degree of freedom in layout or the insulating performance of the semiconductor element is not impaired.

In power semiconductor device 101 according to Embodiment 1, the bonding wire 8w is desirably bonded along the all sides of outer periphery of the bonding region 12 on the upper surface of the heat radiation plate 1. As a result, the shrinkage cavity 7 is suppressed from stretching immediately below the semiconductor element 5; therefore, the wire bonding 6 is appropriately formed on the upper surface of the semiconductor element 5.

In the power semiconductor device 101 according to Embodiment 1, the bonding interval of the bonding wire 8w is desirably 1.0 mm or more and the loop height of the bonding wire 8w is desirably 0.1 mm or more. Such conditions allow the solder 2 to enter under the loops of the bonding wire 8w.

In the power semiconductor device 101 according to Embodiment 1, the bonding wire 8w contains Cu or Ag as a main component, and the solder 2 which is a bonding material containing Sn as a main component. As a result, the solder 2 reacts with the bonding wire 8w to generate an intermetallic compound. Therefore, the crack 9 generated in the horizontal direction is suppressed during the temperature cycle test because the solder 2 withstands the stress generated due to the difference in linear thermal expansion coefficient between the heat radiation plate 1 and the insulating substrate 3.

A method of the power semiconductor device according to Embodiment 1 includes bonding the bonding wire 8w which is a metal wire on the upper surface of the heat radiation plate 1, bonding the insulating substrate 3, in the upper surface of the heat radiation plate 1, with the solder 2 containing a plurality of elements having different solidification points, mounting the semiconductor element 5 on the upper surface of the insulating substrate 3, and the bonding wire 8w being bonded in the bonding region to which the insulating substrate 3 on the upper surface of the heat radiation plate 1 is bonded, such that the bonding wire 8w surrounds the semiconductor element 5 in plan view. As a result, the shrinkage cavity 7 is suppressed from stretching immediately below the semiconductor element 5; therefore, the wire bonding 6 is appropriately formed on the upper surface of the semiconductor element 5. Further, no dimples are formed on the insulating substrate 3; therefore, the degree of freedom in layout or the insulating performance of the semiconductor element is not impaired.

It should be noted that Embodiment can be appropriately modified or omitted without departing from the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A power semiconductor device comprising:
    a heat radiation plate;
    an insulating substrate including a lower surface metal pattern, an insulating base material, and an upper surface metal pattern, the lower surface metal pattern being bonded in a bonding region on an upper surface of the heat radiation plate with a bonding material containing a plurality of elements having different solidification points;
    a semiconductor element mounted on an upper surface of the insulating substrate; and
    a metal wire bonded in the bonding region on the upper surface of the heat radiation plate such that the metal wire surrounds the semiconductor element and is provided within a perimeter of the lower surface metal pattern in plan view.

2. The power semiconductor device according to claim 1, wherein
    the metal wire is bonded along an entire outer periphery of the bonding region on the upper surface of heat radiation plate.

3. The power semiconductor device according to claim 1, wherein
    a bonding interval of the metal wire is 1.0 mm or more, and
    a loop height of the metal wire is 0.1 mm or more.

4. The power semiconductor device according to claim 3, wherein
    the metal wire provides a surface tension to the bonding material that prevents the formation of a cavity in the bonding material after solidification by contraction of the bonding material.

5. The power semiconductor device according to claim 1, wherein
    the metal wire contains Cu or Ag as a main component, and
    the bonding material contains Sn as a main component.

6. The power semiconductor device according to claim 1, wherein
    the metal wire reacts with the bonding material to form an intermetallic compound.

7. A manufacturing method of a power semiconductor device comprising:
    bonding a metal wire on an upper surface of a heat radiation plate;
    bonding an insulating substrate, which includes a lower surface metal pattern, an insulating base material, and an upper surface metal pattern, in an upper surface of the heat radiation plate, with a bonding material containing a plurality of elements having different solidification points; and
    mounting a semiconductor element on an upper surface of the insulating substrate, wherein
    the metal wire is bonded in a bonding region to which the insulating substrate on the upper surface of the heat radiation plate is bonded, such that the metal wire surrounds the semiconductor element and is provided within a perimeter of the lower surface metal pattern in plan view.

* * * * *